(12) United States Patent
Parsons

(10) Patent No.: US 7,655,860 B2
(45) Date of Patent: Feb. 2, 2010

(54) NANO-STRUCTURED PHOTOVOLTAIC SOLAR CELL AND RELATED METHODS

(75) Inventor: Gregory Parsons, Raleigh, NC (US)

(73) Assignee: North Carolina State University, Raleigh, NC (US)

( * ) Notice: Subject to any disclaimer, the term of this patent is extended or adjusted under 35 U.S.C. 154(b) by 567 days.

(21) Appl. No.: 11/394,560

(22) Filed: Mar. 31, 2006

(65) Prior Publication Data

US 2007/0025139 A1    Feb. 1, 2007

Related U.S. Application Data

(60) Provisional application No. 60/667,500, filed on Apr. 1, 2005.

(51) Int. Cl.
*H01L 31/0256* (2006.01)
*H01L 51/44* (2006.01)

(52) U.S. Cl. .................. 136/263; 136/243; 136/252; 429/111; 257/40

(58) Field of Classification Search ......... 136/252–265; 429/111; 257/40
See application file for complete search history.

(56) References Cited

U.S. PATENT DOCUMENTS

| | | | |
|---|---|---|---|
| 4,618,509 A | 10/1986 | Bulkowski | |
| 5,280,183 A | 1/1994 | Batzel et al. | |
| 5,441,827 A | 8/1995 | Grätzel | |
| 6,232,547 B1 | 5/2001 | Meissner et al. | |
| 6,281,430 B1 | 8/2001 | Lupo et al. | |
| 6,307,147 B1 | 10/2001 | Bird et al. | |
| 6,407,330 B1 * | 6/2002 | Lindsey et al. | 136/263 |
| 6,596,078 B2 * | 7/2003 | Konakahara et al. | 117/75 |
| 2002/0037249 A1 | 3/2002 | Konakahara et al. | |
| 2003/0145779 A1 | 8/2003 | Alivisatos et al. | |
| 2005/0150541 A1 * | 7/2005 | Scher et al. | 136/250 |

FOREIGN PATENT DOCUMENTS

| WO | WO 98/50393 A1 | 11/1998 |
|---|---|---|
| WO | WO 02/09197 A1 | 1/2002 |

OTHER PUBLICATIONS

Bach et al. "Solid-state dye-sensitized mesoporous TiO₂ solar cells with high photon-to-electron conversion efficiencies" *Nature* 395:583-585 (1998).
Baxter et al. "Nanowire-based dye-sensitized solar cells" *Applied Physics Letters* 86:053114-1to 053114-3 (2005).
Huynh et al. "Hybrid Nanorod-Polymer Solar Cells" *Science* 295:2425-2427 (2002).
Neugebauer et al. Stability and photodegradation mechanisms of conjugated polymer/fullerene plastic solar cells *Solar Energy Materials & Solar Cells* 61:35-42 (2000).
Notification of Transmittal of the International Search Report and the Written Opinion of the International Search Authority, or the Declaration for PCT/US2006/011908; date of mailing Oct. 17, 2006.
Petritsch et al. "Dye-based donor/acceptor solar cells" *Solar Energy Materials & Solar Cells* 61:63-72 (2000).

* cited by examiner

*Primary Examiner*—Nam X Nguyen
*Assistant Examiner*—Jayne Mershon
(74) *Attorney, Agent, or Firm*—Myers Bigel Sibley & Sajovec

(57) ABSTRACT

A solar cell includes a substrate having a horizontal surface, and an electrode layer on the substrate. The electrode has a plurality of vertical surfaces substantially perpendicular to the horizontal surface, and light-harvesting rods are coupled to the vertical surface of the electrode.

18 Claims, 9 Drawing Sheets

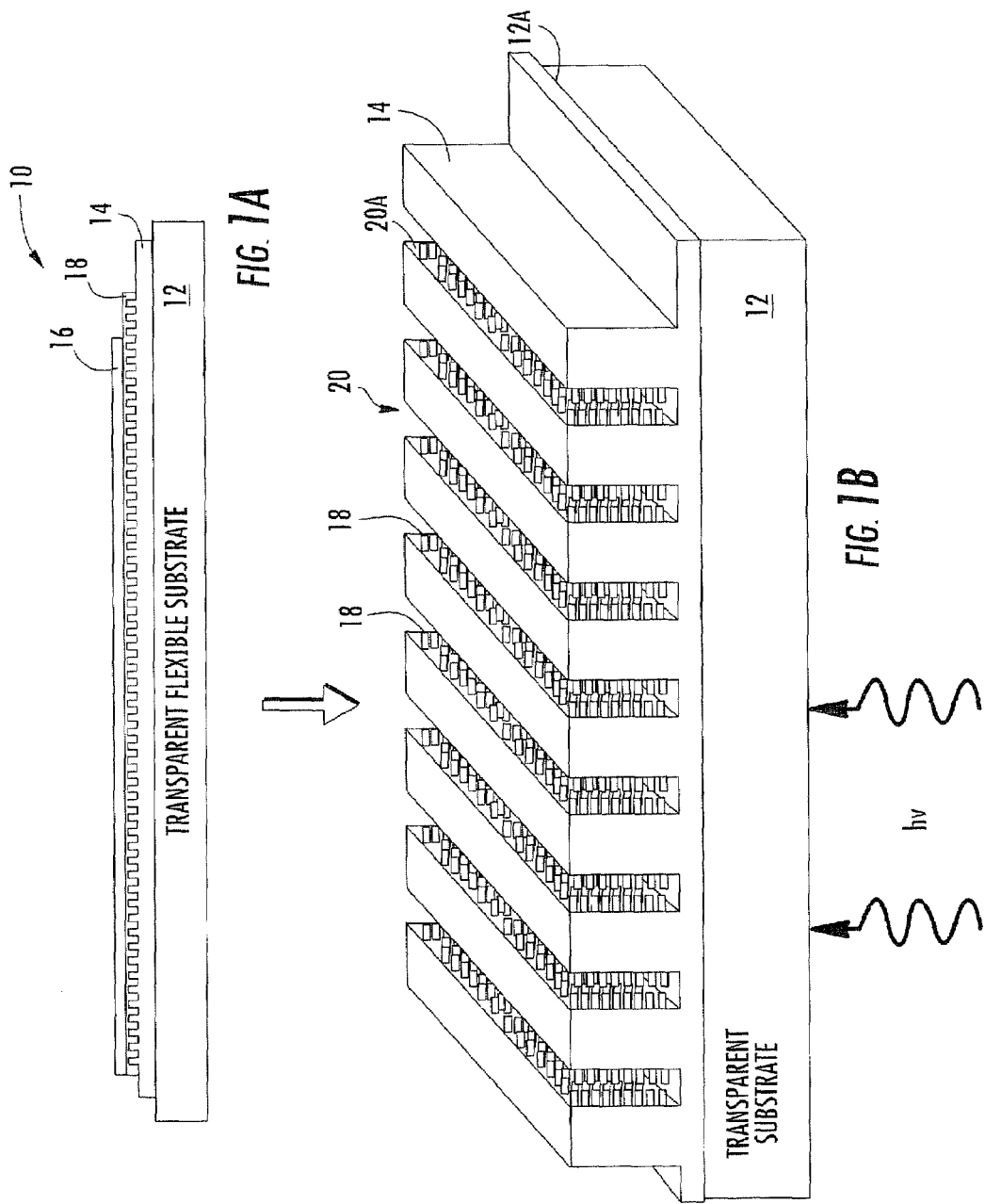

NANO-STRUCTURED PHOTOVOLTAIC SOLAR CELL AND RELATED METHODS

RELATED APPLICATIONS

This application claims priority to U.S. Application Ser. No. 60/667,500 filed Apr. 1, 2005, the disclosure of which is incorporated herein in its entirety.

BACKGROUND OF THE INVENTION

The present invention relates to solar cells and, more particularly, to photovoltaic solar cells.

Attempts to prepare molecular-based solar cells have generally employed molecules in conjunction with semiconducting films (often TiO2) or nanorods (such as CdSe). Conventional molecular-based cells employ several designs. For example, a monolayer of pigment or a thin film of pigment can be deposited on the semiconductor surface. As another example, U.S. Pat. No. 5,441,827 to Grätzel proposes a monolayer of pigment bound to a mesoporous semiconductor surface. The solar cells proposed in U.S. Pat. No. 5,441,827 to Grätzel generally require that the pigment be contained in a diffusive charge carrier, such as a gel or polymeric hole transport layer, to transport electrons.

In each of these designs, the absorption of light by the pigment can result in electron injection into the semiconductor. The hole residing on the pigment is then transferred (typically by a diffusive redox-active agent in a liquid) to the counterelectrode to complete the circuit. High solar-energy conversion efficiency typically requires absorption of most of the incident light across the solar spectrum, a high quantum yield of electron injection, a low quantum yield of charge recombination at the electrode surface, efficient electron transport in the semiconductor to the external circuit, and efficient transport of the hole to the counterelectrode.

However, in practice, conventional molecular-based cellular designs are limited in their efficiency. For example, a monolayer of photon-absorbing pigment typically absorbs only a tiny fraction of the incident light. A thin film can absorb much of the incident light, but the resulting excited-state energy may not reach the semiconductor surface, or the hole generated upon electron injection at the semiconductor may be trapped in the thin film and not reach the counterelectrode. In a monolayer of pigment bound to a mesoporous semiconductor surface, the mesoporous nature of the semiconductor material ensures high absorption of light. However, the mesoporous structure also presents many opportunities for electron-hole recombination. The efficiencies of these solar cells range from <1% for monolayer pigments to a few percent for thin film pigments and generally to a maximum of ~10% for monolayers bound to a mesoporous semiconductor surface.

Quantum dots have also been used in solar cells. Quantum dots can provide intensive absorption, and the wavelength of absorption can be tuned by altering the size of the particles. However, the organization of the quantum dots in a superstructure to efficiently channel energy remains a challenge.

SUMMARY OF THE INVENTION

According to embodiments of the present invention, a solar cell includes a substrate having a horizontal surface and an electrode layer on the substrate having a plurality of vertical surfaces substantially perpendicular to the horizontal surface. Light-harvesting rods are electrically coupled to the vertical surface of the electrode.

In some embodiments, the cell includes nano-patterned trenches that include the plurality of vertical surfaces. The electrode can be a nano-patterned layer.

The electrode can be an anode or cathode electron transport and the solar cell can include an alternate patterned or planar cathode or anode electron transport layer.

In some embodiments, the light-harvesting rods are configured to funnel energy to the electron transport layer without a separate diffusive charge carrier.

The plurality of nanopatterned features (such as trenches) can define opposing vertical surfaces, and the light-harvesting rods may be coupled to each opposing vertical surface. A distance between the opposing vertical surfaces can be between about 10 nm and 100 microns. The light-harvesting rods can extend a distance of between about 10 nm and many hundred nanometers away from the vertical surface.

The substrate can be transparent and/or flexible.

In some embodiments, an electrical device can be provided that includes a solar cell as described above and a circuit electrically coupled to the solar cell.

According to further embodiments of the present invention, methods of forming a solar cell include providing a substrate having a horizontal surface and forming an electron or hole transporting electrode on the horizontal surface. The electrode has a plurality of vertical surfaces substantially perpendicular to the horizontal surface. The vertical surfaces can be formed by several methods, including photolithographic patterning, nanoimprint lithography, selective growth of vertical nanowires or nano-pillars, etc. Light-harvesting rods are electrically coupled to the vertical surface of the electrode. The electron or hole transport layer can be formed on the patterned surface, for example, using atomic layer metal deposition techniques. The light-harvesting rods can be formed by depositing a first porphyrinic molecule having a phosphonic acid group and a polymerizable handle in a self-assembled monolayer (SAM) on the electron transport layer. The electron transport layer can be contacted with a solution that includes a second porphyrinic molecule having at least two polymerizable groups, a ligand for a quantum dot, and a quantum dot. The first and the second porphyrinic molecule can be polymerized, and the quantum dot and the second porphyrinic molecule can be coupled with the ligand to form the light-harvesting rods.

BRIEF DESCRIPTION OF THE DRAWINGS

FIG. 1A is a front side view of a photovoltaic cell according to embodiments of the present invention;

FIG. 1B is a perspective view of the photovoltaic cell of FIG. 1A with the cathode removed and a top layer of light-harvesting rods removed;

DETAILED DESCRIPTION OF EMBODIMENTS OF THE INVENTION

Figure 1C:
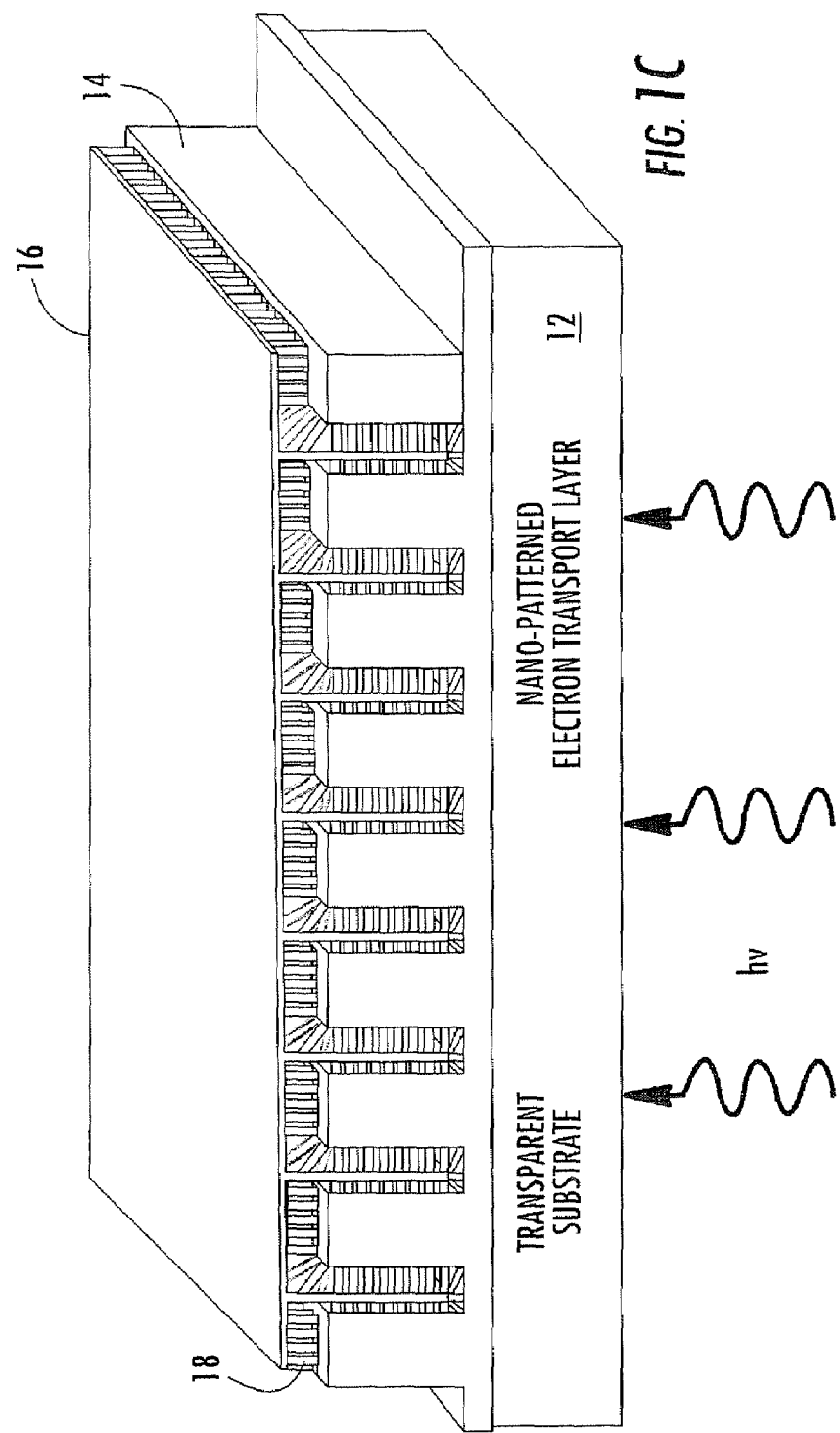
FIG. 1C is a perspective view of the photovoltaic cell of FIG. 1A including the cathode.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

A substrate as used herein may be a solid material (which may be flexible or rigid) suitable for the attachment of one or more molecules. Substrates can be formed of materials including, but not limited to glass, organic polymers, plastic, silicon, minerals (e.g. quartz), semiconducting materials, ceramics, metals, etc. The substrate may be inherently conductive and serve itself as an electrode, or an electrode may be formed on or connected to the substrate by any suitable means (e.g., deposition of a gold layer or a conductive oxide layer). For example, the substrate may be a nano-patterned layer and the electrode layer may be deposited on the nano-patterned substrate. Either or both of the substrates in the solar cells may be transparent (that is, wavelengths of light that excite the chromophores can pass through the substrate and corresponding electrode, even if they are visually opaque). In light-harvesting arrays, the substrate and electrode may be of any suitable type. One of the substrates may be opaque with respect to the wavelengths of light that excite the chromophores. One of the substrates may be reflective or provided with a reflective coating so that light that passes through the arrays or rods is reflected back to the arrays or rods.

The term "electrode" refers to any medium capable of transporting charge (e.g. electrons or holes) to and/or from a light harvesting rod. Examples of electrodes are metals (e.g., gold, aluminum), non-metals (e.g., conductive oxides, carbides, sulfide, selinides, tellurides, phosphides, and arsenides such as cadmium sulfide, cadmium telluride, tungsten diselinide, gallium arsenide, gallium phosphide, etc.), conductive organic molecules or polymers, and conductive electrolyte liquids. The electrodes can be manufactured to virtually any 2-dimensional or 3-dimensional shape.

The term "porphyrinic macrocycle" refers to a porphyrin or porphyrin derivative. Such derivatives include porphyrins with extra rings ortho-fused, or ortho-perifused, to the porphyrin nucleus, porphyrins having a replacement of one or more carbon atoms of the porphyrin ring by an atom of another element (skeletal replacement), derivatives having a replacement of a nitrogen atom of the porphyrin ring by an atom of another element (skeletal replacement of nitrogen), derivatives having substituents other than hydrogen located at the peripheral (meso-, .beta.-) or core atoms of the porphyrin, derivatives with saturation of one or more bonds of the porphyrin (hydroporphyrins, e.g, chlorins, bacteriochlorins, isobacteriochlorins, decahydroporphyrins, corphins, pyrrocorphins, etc.), derivatives obtained by coordination of one or more metals to one or more porphyrin atoms (metalloporphyrins), derivatives having one or more atoms, including pyrrolic and pyrromethenyl units, inserted in the porphyrin ring (expanded porphyrins), derivatives having one or more groups removed from the porphyrin ring (contracted porphyrins, e.g., corrin, corrole) and combinations of the foregoing derivatives (e.g. phthalocyanines, porphyrazines, naphthalocyanines, subphthalocyanines, and porphyrin isomers). Exemplary porphyrinic macrocycles include at least one 5-membered ring.

The term "porphyrin" refers to a cyclic structure typically composed of four pyrrole rings together with four nitrogen atoms and two replaceable hydrogens for which various metal atoms can readily be substituted. A typical porphyrin is hemin.

The term "multiporphyrin array" refers to a discrete number of two or more covalently-linked porphyrinic macrocycles. The multiporphyrin arrays can be linear, cyclic, or branched, but are preferably linear herein. Light harvesting rods herein are preferably multiporphyrin arrays. The light harvesting rods or multiporphyrin arrays may be linear (that is, all porphyrinic macrocycles may be linked in trans) or may contain one or more bends or "kinks" (for example, by including one or more non-linear linkers in a light-harvesting rod, or by including one or more cis-substituted porphyrinic macrocycles in the light harvesting rod) Some of the porphyrinic macrocycles may further include additional ligands, particularly porphyrinic macrocycles, to form sandwich coordination compounds. Light harvesting rods can be integrated with other light harvesting features, such as quantum dots.

A "chlorin" is essentially the same as a porphyrin, but differs from a porphyrin in having one partially saturated pyrrole ring. The basic chromophore of chlorophyll, the green pigment of plant photosynthesis, is a chlorin.

A "bacteriochlorin" is essentially the same as a porphyrin, but differs from a porphyrin in having two partially saturated non-adjacent (i.e., trans) pyrrole rings.

The term "electrically coupled" when used with reference to a light harvesting rod and electrode, or to chromophores, charge separation groups and electrodes, refers to an association between that group or molecule and the coupled group or electrode such that electrons move from the storage medium/molecule to the electrode or from the electrode to the molecule and thereby alter the oxidation state of the storage molecule. Electrical coupling can include direct covalent linkage between the storage medium/molecule and the electrode, indirect covalent coupling (e.g. via a linker), direct or indirect ionic bonding between the storage medium/molecule and the electrode, or other bonding (e.g. electrostatic or hydrophobic bonding). In addition, no actual bonding may be required and the light harvesting rod may simply be contacted with the electrode surface. There also need not necessarily be any contact between the electrode and the light harvesting rod where the electrode is sufficiently close to the light harvesting rod to permit electron tunneling between the medium/molecule and the electrode.

The term "nano-patterned" or "nano-structured" refers to a protrusion or void having a diameter in at least one direction of about 1 to about 500 nm. A nano-patterned material is typically a predetermined, organized structure, such as a structure having a predetermined shape (e.g., a trench or pillar) and/or a repeated pattern. A nano-patterned material can have a pattern that is not random.

According to embodiments of the present invention, light-harvesting rods are coupled to a nano-patterned electron transport layer in a photovoltaic cell, such as the solar cell 10 illustrated in FIG. 1A. The solar cell 10 includes a transparent substrate 12 having an anode 14 and a cathode 16 separated by light-harvesting rods 18.

As shown in FIGS. 1B-1C, the anode 14 is a nano-patterned electron transport layer that includes trenches 20. The trenches 20 define a sidewall surface 20A that is substantially perpendicular to a horizontal surface 12A of the substrate 12. The light-harvesting rods 18 are coupled to the sidewall surface 20A of the anode 14.

The anode 14 is formed from a high work function material, such as nickel oxide, platinum, Poly(3,4-ethylenedioxythiophene) poly(styrenesulfonate) (PEDOT:PSS), or p-type silicon. The cathode 16 is formed of a low work function material, such as aluminum, titania, fullerene, or n-type silicon. Although embodiments of the present invention are illustrated in FIGS. 1A-1C with respect to the anode 14 and the cathode 16, it should be understood that the polarities may be reversed, i.e., the element described as the anode 14 can be configured to function as a cathode and the element described as the cathode 16 can be configured to function as an anode. Therefore, although the sidewall surface 20A is described as being a part of the anode 14, the sidewall surface 20A may be provide either as part of an anode or cathode layer. In addition, although the solar cell 10 is illustrated as a "single junction" cell having one anode 14 and one cathode 16, "multiple junction" cells may be provided with additional stacked anode and cathode layers having the patterned configuration shown with respect to the cell 10. Electrode layers, such as the anode 14 or cathode 16, can be formed using deposition techniques and nano-patterning techniques, including those techniques known to those of skill in the art, such as physical vapor deposition (PVD), chemical vapor deposition (CVD), atomic layer metal deposition (ALD), or liquid phase deposition.

As illustrated in FIGS. 1A-1C, the sidewall surfaces 20A are formed by etching the anode 14 to form the trenches 20, which extend across the anode 14 in one direction. However, it should be understood that other configurations can be used to form the sidewall surfaces 20A, such as other etching patterns. For example, the trenches 20 can extend in more than one direction. Pillars or nano-wires can be formed that are square in cross section, cylindrical, or other shapes may be provided.

As illustrated in FIGS. 1A-1C, light incident on the transparent substrate 12 is absorbed by the light-harvesting rods 18. The light harvesting rods 18 transport electrons to the anode 14, thus providing a current between the anode 14 and cathode 16.

In this configuration, the volume of photon-absorbing particles that are exposed to light can be increased, for example, as compared with conventional monolayer photon-absorbing pigment configurations. Difficulties of interconnected nanoparticle structures, such as the "dead-ends" in electron transport through a nanowire assembly may also be reduced. Moreover, electron/hole transport can be provided without requiring a diffusive charge carrier, such as in the solar cell proposed in U.S. Pat. No. 5,441,827 to Grätzel; however, it should also be understood that a diffusive charge carrier may be used in some embodiments.

Although the light harvesting rods 18 as illustrated substantially cover the surface of the anode 14, it should be understood that the rods 18 may be provided on a portion of the surface. For example, the rods 18 may be provided on the vertical sidewall surfaces 20A and omitted from the horizontal top surface of the anode 14.

The substrate 12 can be transparent and/or flexible. For example, the substrate 12 can be formed of glass, polyethylene terephthalate (PET), polycarbonate, or other materials. In particular embodiments, a transparent, flexible substrate, such as substrate 12, having a horizontal surface is provided. An electrode, such as the anode 14, is provided on the horizontal surface 12A of the substrate 12. The trenches 20 are formed and define a substantially vertical sidewall surface 20A substantially perpendicular to the horizontal surface 12A of the substrate 12.

The light-harvesting rods 18 can include a plurality of photon-absorbing particles, such as quantum dots, porphyrin molecules and/or other photoactive or semiconducting materials. Examples of photon-absorbing particles are discussed, for example, in U.S. Pat. No. 6,407,330 to Lindsey et al., the disclosure of which is hereby incorporated by reference as if fully set forth herein. For example, accessory pigments, such as quantum dots, can be incorporated into the matrix of porphyrin polymers to enhance absorption and/or promote cross-linking between the light-harvesting rods 18.

Figure 2:
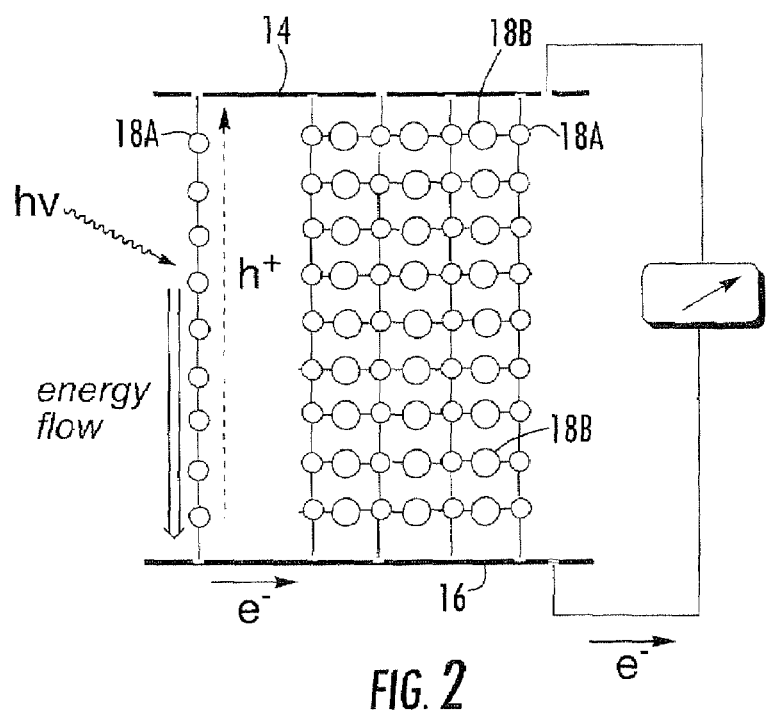
FIG. 2 is a schematic diagram of the light-harvesting rods of the photovoltaic cell of FIG. 1A.

As illustrated in FIG. 2, the light-harvesting rods 18 include linked porphyrinic macrocycle molecules 18A and quantum dots 18B. The quantum dots 18B are integrated into the porphyrin-structured light-harvesting rod 18.

The light-harvesting rods 18 can be formed by depositing a porphyrinic molecule having a phosphonic acid group and a polymerizable handle in a self-assembled monolayer (SAM) or molecularly assembled polymeric multilayer, on the sidewall surface 20A of the anode 14. In some embodiments, the sidewall surface 20A is contacted with a solution that includes another porphyrinic molecule that has at least two polymerizable groups, a ligand for a quantum dot, and a quantum dot. In other embodiments, the sidewall surface 20A is exposed to a vapor that includes the other porphyrinic molecule that has the at least two polymerizable groups, the ligand for a quantum dot, and the quantum dot. The porphyrinic molecules can be polymerized, for example, by heating the solution or vapor. The quantum dot 18B is coupled to the porphyrinic molecule 18A with the ligand to form the light-harvesting rod 18.

Without wishing to be bound by any particular theory, the molecular photovoltaic cell 10 of FIGS. 1A-1C and 2 may combine the benefits of energy transduction in 3-D self-assembled porphyrin photo-antennas with high absorption coefficients available with inorganic nanoparticle systems. The cell 10 may employ the light-harvesting rods using processes similar to those observed in photosynthetic bacteria, which may employ a light-harvesting antenna complex including numerous pigments coupled to a reaction center for energy transduction. Absorption of light by a pigment in the antenna may be followed by rapid (e.g., singlet exciton) excited-state energy migration among the antenna chromophores until the energy reaches the lowest energy site, which is the special pair of porphyrinic pigments in the reaction center. Vectorial excited-state electron transfer then occurs, with the electron moving along a chain of porphyrinic and other cofactors in the reaction center toward one side of the membrane. The hole remaining on the special pair migrates in the opposite direction (intrinsic rectification) toward the other membrane surface and out of the reaction center, thereby generating a transmembrane potential. In bacterial systems, hole transport is mediated by a series of iron porphyrins. Thus, four major functions may be performed by porphyrinic pigments underlie photosynthetic function: (1)

light absorption, (2) exciton energy migration, (3) excited-state electron transfer, and (4) ground-state hole/electron migration. The efficiency of these combined processes may be the result of the overall design, the inherent optical/electronic properties of the pigments, and/or the 3-dimensional organization of all components. These functions may also be performed by the cell 10 of FIGS. 1A-1C.

With continued reference to FIGS. 1A-1C, the cell 10 may use porphyrins to perform the same four basic functions as in photosynthesis described above. In the cell 10, the light-harvesting porphyrin rods 18 (or photo-antennae) are sandwiched between a semiconductor (anode 14) and a counter-electrode (cathode 16). As illustrated in FIG. 2, accessory pigments (such as quantum dots 18B) can be incorporated in the matrix of the porphyrin polymers 18A to enhance absorption and promote cross-linking between the vertical rods.

In some embodiments, nano-patterned layers (e.g., the anode 14 of the cell 10 of FIGS. 1A-1C) may be characterized by an aspect ratio. As used herein, the aspect ratio is the ratio between the height/depth of a feature (e.g., the trenches 20) and the separation distance between features. For example, the cell 10 may have an aspect ratio of between about 2:1 and 5:1 or between about 2:1 and 10:1 or larger. Nano-patterned layers according to the present invention may also be characterized by a pitch ratio, i.e., the ratio of a feature diameter to the separation distance between features. For example, the anode 14 of the cell 10 can have a pitch ratio of between about 1:1 to 10:1 or greater. The distance between features in nano-patterned layer according to the present invention can be sufficient to accommodate the light-harvesting rods 18. For example, the distance between features in the nano-patterned layer can be greater than about 10 nm or 20 nm and, in some embodiments, may be about 100 nm to 500 nm or greater.

The configuration shown in FIGS. 1A-1C and 2 can function as follows: (1) Absorption of light by one of the pigments (e.g., quantum dots 18B) yields the singlet excited state (exciton), which migrates from pigment to pigment along the backbone of the rod 18 until reaching the lowest energy chromophore pigment, which is adjacent and attached to the semiconductor anode 14. (2) This last pigment can function as the electron-injection unit and may undergo excited-state electron transfer, injecting an electron into the semiconductor. (3) The hole residing on the electron-injection unit can then migrate among pigments in the light-harvesting rod 18 until the cathode 16 is reached, thereby completing the circuit and regenerating the rod 18 for another photocycle. The exciton and hole motion within the cell 10 may be driven by a built-in energy profile, where the exciton-energy level and the ground state oxidation potential of each porphyrin monomer can be chosen to achieve directed (vectorial) migration of excited-state energy and ground-state holes in opposite directions along a given light-harvesting rod. This approach can provide intrinsic rectification, which can in turn reduce or eliminate the need for a diffusive charge carrier in a liquid or gel.

Thus, the light harvesting rod 18 can be used for the dual purposes of light collection and energy funneling (including exciton migration, electron transfer, and hole migration). The hole-transport features of the cell 10 may reduce or eliminate the need for a diffusive charge carrier in a liquid electrolyte. Accordingly, the cell can be made ultrathin without incorporation of a liquid phase. Exciton-quenching by the presence of a migrating hole may be reduced. Under typical solar flux conditions, each porphyrin monomer (porphyrin molecule 18A) absorbs approximately 1 photon per second. By contrast, the energy migration rate between pigments on the backbone of the light-harvesting rod 18 is extremely fast (<10 psec transfer time per pigment). The hole migration rate may be somewhat slower (<1 μsec per pigment), but still many orders of magnitude faster that the expected photon absorption rate. Hole/exciton interactions may be minimal, promoting efficient exciton and hole transport. Moreover, the polymeric porphyrin molecules 18A form a chain that may restrict exciton and hole transport to a single polymeric backbone, limiting interaction between neighboring absorbing units (e.g., quantum dots 18B). Thus, the cell 10 may utilize the beneficial oxidation/reduction kinetics of the other molecular/semiconductor systems, and offer potential improvements in exciton transport, hole transport, energetics, and in reduced recombination due to improved hole transfer to the cathode electrode.

Two complementary methods that may be used to increase the photoabsorption spectrum are as followed (as illustrated in FIGS. 1A-1C and 2): (1) integration of photo-collecting semiconducting quantum dots with the porphyrin polymer chains with optical absorption and electron affinity tuned to complement the photon absorbance and charge-transfer properties of the porphyrin polymers; and (2) a nano-engineered electron transport surface to increase effective cell surface area and enable direct electron transport to the anode without introducing "dead end" charge-trapping centers common in solar cells with nano-rod or nano-cluster electron-transport networks.

The structure may also be compatible with low cost high throughput processing. A large area of the nano-patterned electron transport layer, such as the anode 14 can be formed, for example, having an area of between about several square centimeters up to a square meter or more. The cathode layer (e.g., the cathode 16) can then be formed to contact the top of the conformal porphyrin layer (e.g., the light harvesting rods 18). Nanostructured cells may be tested with polymer electrolyte and planar cathodes. Several thin film deposition techniques, including low temperature atomic layer metal deposition, vapor-phase processing, or liquid phase processing, can be used to deposit the cathode 16 to achieve highly conformal cathode deposition under low temperature conditions. Multijunction cells can be formed, for example, having one or more series of an additional nano-patterned anode, light-harvesting rods, and a cathode formed on the cathode 16. Individual layers of such a multifunction cell can be designed to optimize absorption over different parts of the solar spectrum. Molecular structures may be synthesized that can enable resonant energy transfer from quantum dots that absorb in spectral regions where the porphyrins absorb poorly.

Energy profiles for vectorial exciton and hole transport may be optimized, for example, by designing a porphyrinic polymer structure, and/or by controlling fixed and trapped charge at internal cell interfaces. Surface polymerization approaches may be selected that enable uniform molecular weight polymer formation over large surface areas.

The fraction of visible light absorbed may be improved by incorporating semiconductor quantum dots onto the molecular antenna backbone, and using three-dimensional fabricated horizontal semiconductor nanowires or vertical nanopillars for vertical stacking of porphyrin polymers. High photoabsorption in the near infrared range may be obtained by developing molecular building blocks based on hydroporphyrins and phthalocyanines with narrow HOMO/LUMO gaps and by attaching quantum dots with longer wavelength photoabsorption onto porphyrin antenna backbone with energy levels designed for efficient energy transfer. The energy level matching may be improved in quantum dot/hydroporphyrin structure to achieve efficient energy transport from nanoparticles by examining and modeling the effect of nanoparticle structure on energy transfer efficiency. For example, the fabrication of a smooth anatase $TiO_2$ anode and the deposition of highly conformal cathode metals onto nanostructured porphyrin layers can be accomplished by using atomic layer vapor deposition and solvent enhanced deposition techniques The energy profile in a cell may be optimized to achieve a higher quantum efficiency, $V_{oc}$, with sufficient internal fields to achieve vectorial exciton and hole transport by using electrochemical and vacuum spectroscopic tools to relate energy profiles in monomeric and polymeric porphyrins and other sensitizers with cell performance parameters. The effects of the fabrication processes on organic/inorganic interface composition and structure and the relation to photovoltaic cell parameters can also be examined. The kinetics of exciton and hole transport along molecular backbone, and charge separation and recombination at porphyrin/electrode interfaces can be studied by using time resolved absorption and fluorescence measurements to determine the effect of molecular state energetics on charge transport and lifetimes, and by relating energy profiles along porphyrin polymer backbone with the quantum efficiency, $V_{oc}$, integrated photocurrent and fill-factor determined from cell characterization.

The photocollector degradation mechanisms, including the effect of regeneration rate on porphyrin lifetime, may be studied by relating time-resolved laser spectroscopic results to cell lifetime measurements. The role of space charge on photocurrent transport can be studied by counter ions and charge compensating surface treatments and relating to electron/hole transport rates determined from electrochemical and cell performance measurements A high density of porphyrin monolayers and surface polymerized multilayers may be achieved by electrochemical and spectroscopic tools to relate attachment and polymerization approaches to film density and structure.

Embodiments of the present invention are described with respect to the following non-limiting examples.

Molecular Components of Light Harvesting Rods

Porphyrinic macrocycles in multicomponent architectures that can be used as light harvesting rods 18 in FIGS. 1A-1C may be carried out using porphyrins, hydroporphyrins, such as chlorins and bacteriochlorins, and/or phthalocyanines. Chlorins generally exhibit strong absorption in the near-IR (analogous to chlorophylls). Phthalocyanines also exhibit very strong absorption in the red ($\epsilon_{700\,nm}$ ~200,000 $M^{-1}$ $cm^{-1}$) and differ from hydroporphyrins in having a very high oxidation potential (E ~1.0 V). The published redox potentials for phthalocyanines may be inconsistent and often include relatively low values. The low values may be due to solution dimers/aggregates. Spectral parameters can be tuned by use of substituents (e.g., ethynes on the porphyrins, annulations on the phthalocyanines), thereby moving the long-wavelength absorption maximum into the near-IR. Hydroporphyrins and phthalocyanines are a class of pigments that can afford intense absorption in the red/near-IR and has the desired synthetic amenability.

Hydroporphyrins and phthalocyanines may be utilized along with porphyrins and accessory pigments (e.g., perylenes and quantum dots) to prepare architectures. Hydroporphyrins and phthalocyanines may be used because (1) they show strong red absorption thereby extending the spectral coverage for photon absorption, (2) their diverse excited-state energies may be a good basis for energy cascade systems, (3) their diverse redox characteristics may be used to tune rates and yields of charge (hole/electron) transfer, and/or (4) their increased visible absorption oscillator strengths and radiative emission rates may enhance through-space energy transfer. Additionally, hydroporphyrins may be linear oscillators, whereas porphyrins are generally planar oscillators, which when exploited in a properly designed architecture may provide greater directionality of energy transfer.

However, synthetic methodology may provide access to chlorin/oxochlorin building blocks with various patterns of substituents. Synthetic access may also be gained to phthalocyanine and bacteriochlorin building blocks.

Surface Polymerization of Porphyrin and Quantum Dot Photo-Antennae

The light-harvesting rod nanostructure, for example, as illustrated in FIGS. 1A-1C and FIG. 2, may be formed using a self-organization approach that follows four steps: (1) A porphyrinic molecule bearing a phosphonic acid group and a polymerizable handle is deposited in a self-assembled monolayer (SAM) on the planar (or nanostructured) surface. This molecule may serve as the long-wavelength trap and may ultimately inject electrons into the surface. (2) A solution or vapor containing (i) a porphyrinic molecule bearing two polymerizable groups and one ligand for a quantum dot, and (ii) a quantum dot, is deposited on the SAM. (3) The surface and the solution or vapor is heated, thereby driving off the solvent and initiating the polymerization of porphyrins to give rods and linkage of the porphyrins to the quantum dots. (4) The resulting film is washed.

Figures 5, 6:
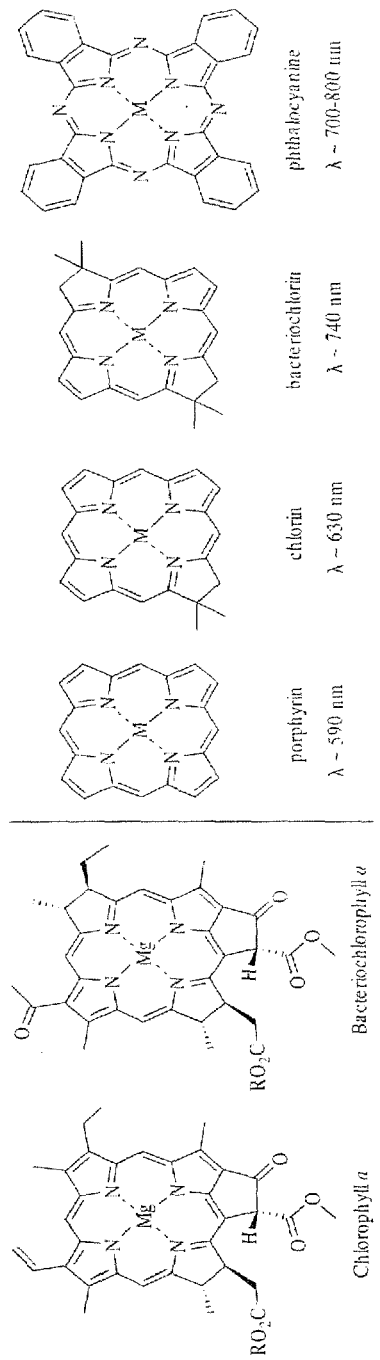
FIG. 5 is a diagram of porphyrin, hydroporphyrin, and phthalocyanine structures according to embodiments of the present invention.
FIG. 6 is a diagram of chlorine molecules for inclusion into a photocell according to embodiments of the present invention.

An example of chlorin building blocks that can be used in solar cells is shown in FIG. 6. One chlorin binds to the surface, positioning the ethyne group in the vertical direction. Layering on the second chlorin building block followed by heating to cause polymerization gives the desired film. Quantum dots can be incorporated by linkage to a site on the chlorins, as indicated. In this manner, the quantum dots are incorporated into the film by appendage to the porphyrinic units as the polymerization is carried out.

The thickness of the film can be controlled by the conditions used during the fabrication of the film (e.g., flux, time, temperature). Using the surface polymerization approach, stacks of porphyrin monolayers (including quantum dots of desired spectral properties) may be built up to produce the desired photoabsorbance and energy-transfer cascade from the top to bottom of the cell. The linkers joining the porphyrinic pigments can be varied as required to control the rate of energy flow. The porphyrinic components may be tailored to achieve the appropriate spectral properties for energy flow and electrochemical properties for hole migration. Such tailoring can be achieved through the incorporation of substituents at the perimeter of the macrocycle as well as the choice of centrally chelated metal.

Figure 7:
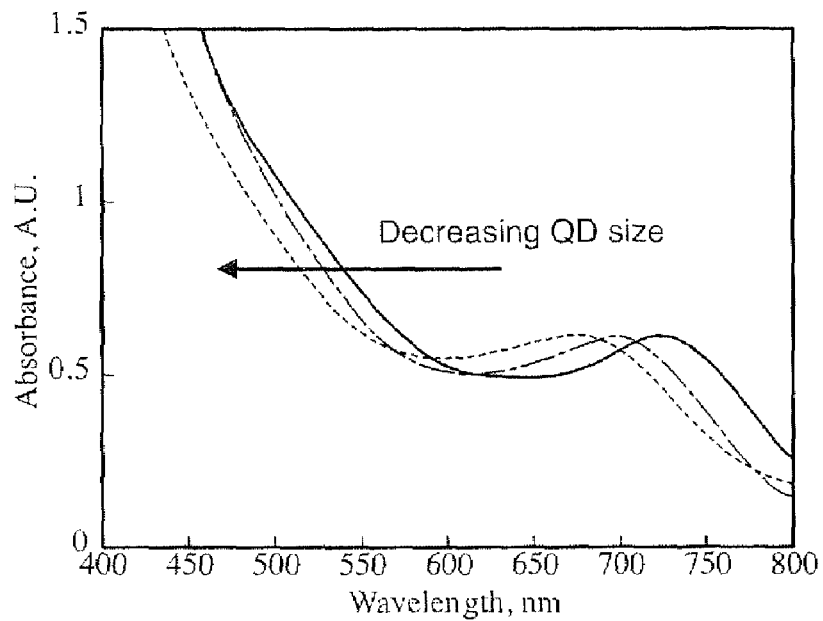
FIG. 7 is a graph of light absorption as a function of size for InAs quantum dots in toluene according to embodiments of the present invention.

The absorption spectra of colloidal semiconductor quantum dots can be tuned by dot size without changing the chemical composition, for example, InAs, PbSe, PbTe, CdSe and/or PbS QD-$TiO_2$ dye-sensitized solar cell quantum dots can be used. It should be understood that any suitable quantum dot can be used. FIG. 7 illustrates the absorption spectra obtained by varying the size of InAs nanocrystals. Quantization may concentrate the oscillator strength of the bulk material into a few transitions to enable tuning of energy profiles at quantum dots and/or organic heterojunctions. Quantum dots may be more resistant to photobleaching than organic dyes, and they can have fluorescent properties—for example, the infrared emission of PbSe quantum dots may be hundreds of times greater than emission from the best organic dye in this spectral region.

There are many examples illustrating that quantum dots can efficiently collect light and transfer charge. InAs quantum dots photosensitize nanocrystalline $TiO_2$ with high efficiency (60+%) in a dye-sensitized solar cell. The quantum dots may be used in light harvesting rods to absorb light and transfer excitonic energy to the porphyrin. The quantum dot-porphyrin electronic state structure may be matched to promote favorable exciton transfer to reduce competing (and deleterious) electron transfer. Electrochemical techniques may enable the determination of the ionization potential and electron affinity of quantum dots relative to that of the porphyrin molecules. For example InAs and/or CdSe quantum dots may be fabricated and incorporated into light-harvesting rods.

Molecular Characterization

Electrochemistry and Spectroscopy: Detailed physicochemical studies may be performed on all of the porphyrinic building blocks and multicomponent architectures described herein, including (1) static absorption and emission spectroscopies; (2) resonance Raman spectroscopy; (3) EPR spectroscopy (of paramagnetic species); (4) XPS and IR of surface-bound species; and (5) electrochemical measurements. Mechanisms of energy flow may be studied by evaluating: (1) the electronic structure of the individual molecules; (2) the changes that occur in these properties upon incorporation into multicomponent architectures; and (3) how attachment to the surface affects the properties of the multicomponent architectures. Spectroscopic experiments may be used to examine surface polymerization kinetics and, binding of the accessory pigments and sensitizers to the rods.

The interface between the rods and the surface, including the surface bond formation and molecular orientation of the molecules may also be characterized as follows using a variety of techniques, including techniques known to those of skill in the art. The orientation of the rods and the surface may affect the surface coverage and hence, the light gathering capability. Furthermore, the orientation may affect the interactions between adjacent rods, which could affect the efficiency of charge injection into the surface. Measurements of the surface bound species may be performed using a combination of surface spectroscopic and electrochemical measurements. The optical methods may provide insight into surface polymer structure and chemical binding, whereas the efficiency of electron injection into the surface can be determined from redox properties of the rods determined from electrochemistry and from time resolved measurements.

The Rates, Yields and Mechanisms of Energy and Hole/Electron Transfer: Time-resolved measurements may determine the flow of energy in the molecular or quantum dot nanostructures. (1) Fluorescence lifetime measurements with wavelength selective emission can be used to monitor the emission of particular components (e.g., quantum dot, porphyrin, chlorin, bacteriochlorin or phthalocyanine chromophores) to determine the excited-state lifetime, and by implication the transfer rate (assuming no competing electron-transfer quenching processes), of various components in the rods. Fluorescence lifetimes may be obtained using selective wavelength illumination for the various chromophores. The fluorescence lifetime of the terminal, low-energy components and the energy-transfer donors may be measured and compared with monomeric model compounds, to confirm whether the yield-lifetime relation holds upon incorporation into the array. (2) ΔA experiments may be used to monitor the formation and decay of the excited state of the components in various rods. Rates may be characterized in the femtosecond regime.

Monolayer Porphyrin Photocells

A planar polymeric porphyrin cell (with 20 porphyrin units) may have a maximum cell efficiency of ~4% under AM1.5 illumination. As discussed above, efficiency is limited by the net photon absorbance.

Figure 3:
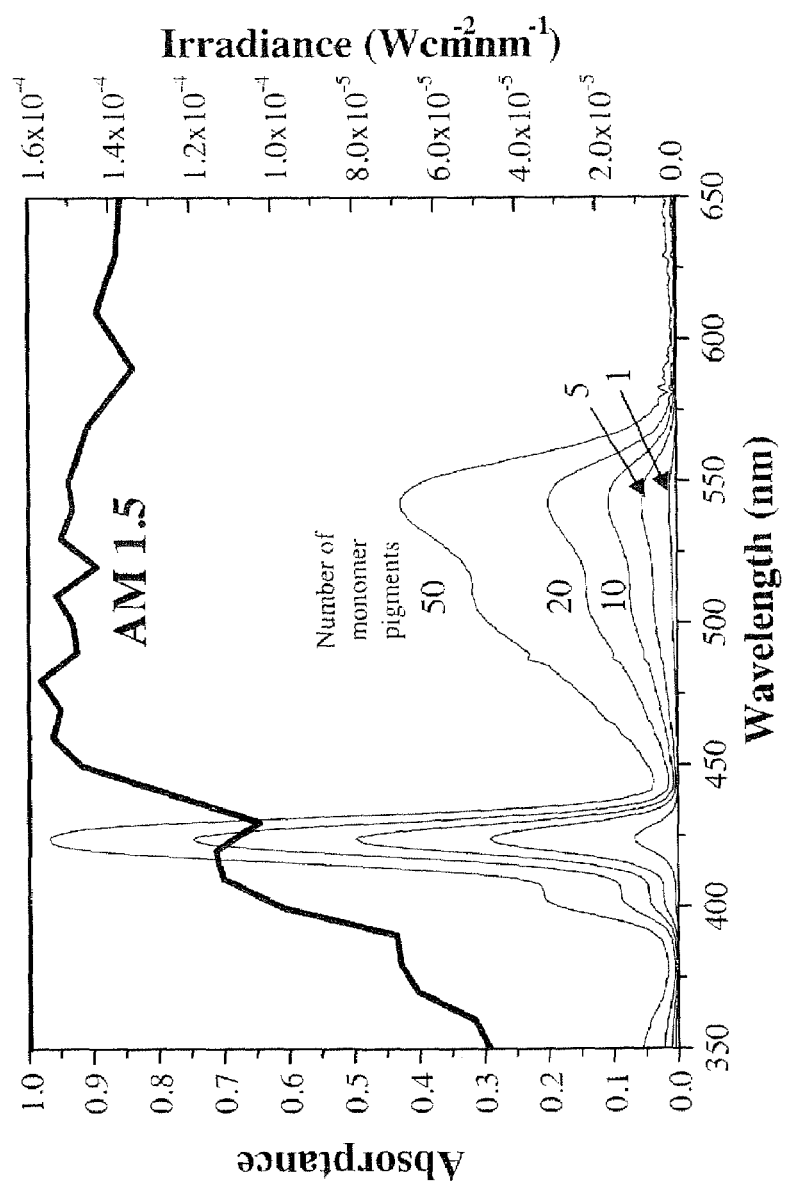
FIG. 3 is a graph of a calculated absorption spectrum for polymeric porphyrin molecules with perylene absorbers attached thereto according to embodiments of the present invention.

An example absorption spectrum of a conventional monolayer porphyrin photocollector (i.e., without trenches 20 shown in FIG. 1B) with two perylene moieties attached is shown in FIG. 3. The porphyrin Soret band at 420 nm and the broad perylene features at 510 and 540 nm can be seen. Under AM1.5 illumination (also shown in FIG. 3), only about 40% of the sun's 100 $mW/cm^2$ is available between 350 and 650 nm corresponding to the long-wavelength absorption bands of the molecular units and quantum dots. Simple models of expected integrated photoabsorptance indicate that a monolayer of rods with approximately 20 porphyrinic pigments results in absorbance of about 10-15% of the available light between 350 and 650 nm, which limits the expected efficiency to less than 4% for the planar porphyrin monolayer. The monolayer cell had an overall photoefficiency<1% under AM1.5 illumination, consistent with the small photoabsorptance expected for a single porphyrin molecular monolayer.

Figure 4:
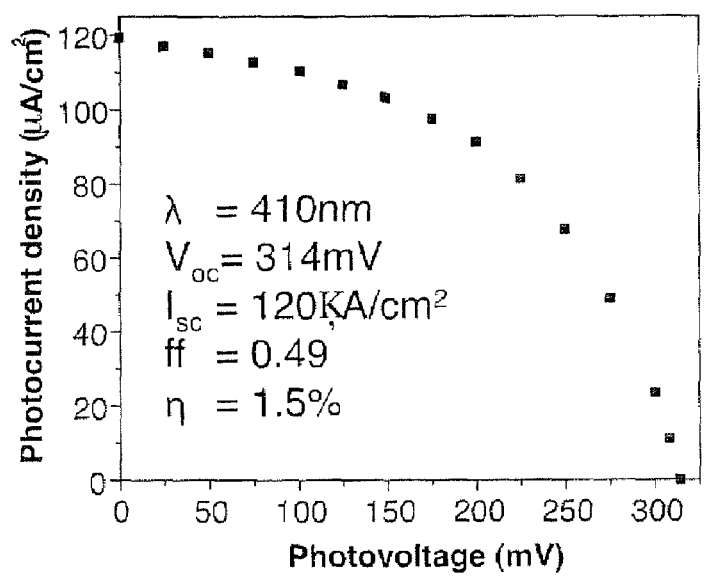
FIG. 4 is a graph of the current voltage curve for a monomer porphyrin photocell.

Planar photovoltaic cells with multilayer porphyrins (up to 6 porphyrins) have been characterized. Quantum efficiencies were measured at 50%, and overall efficiencies of 1.5% were measured for monochromatic illumination (FIG. 4). Electrochemical characterization indicates that <50% of the cell surface area was active in the circuit, possibly due to poor conductor coverage. Also, the electron transport layer was found to have large surface roughness. Roughness may enhance coverage of monomer porphyrins, but may sterically hinder coverage of porphyrin polymers, leading to poor surface coverage densities. The quantum efficiency, $V_{oc}$, values are smaller than the maximum of ~1.5 V for this system. Nevertheless, these initial results may indicate positive photovoltaic performance in the regime of high photon absorbance.

Cells may be fabricated on planar semiconductor ($TiO_2$) surfaces using surface polymerized porphyrin photo-antennas. The porphyrin polymer composition may be formed to achieve a graded ionization energy profile of approximately 0.5 eV across the 40 Å polymer length. Methods that may be used for cathode fabrication in the planar cell include the following: (1) spin-coated polymer hole transport layers (such as PEDOT-PSS or related polythiophenes) with a deposited metal cathode; and (2) direct porphyrin/metal cathode attachment. The polymer hole transport layer approach may be used for cell and materials evaluation. High work function metal cathodes (such as aluminum, $\phi$=4.25 eV; gold, $\phi$=4.25 eV; and platinum, $\phi$=5.32 eV) may be formed by evaporation, sputtering, colloidal film deposition or atomic layer deposition. Atomic layer deposition may enable the highly conformal deposition for the nanostructured cell structure. Photocell characterization as a function of photon flux may include spectroscopic photoabsorption, incident photon to current conversion efficiency, open circuit photovoltage ($V_{oc}$), short circuit photocurrent ($I_{sc}$), fill factor, integrated photocurrent density, and overall cell efficiency. Continuous illumination under various temperature and humidity conditions may be used to assess cell stability. These results may be complemented by time-resolved and steady-state photophysical and electrochemical studies. The combined results can be used to quantify the underlying thermodynamics ($V_{oc}$) and kinetics (I) that govern cell function.

High Efficiency Single and Multijunction Cells

A cell having several percent overall efficiency may be achieved through use of a single-junction cell with porphyrins and chlorins in the polymer backbone and quantum dots as intense absorbers to fill in the spectral regions where the porphyrins and chlorins absorb poorly. InAs quantum dot structures may be used. Phthalocyanine and bacteriochlorin can be used as building blocks in conjunction with porphyrins and chlorins in a film that constitutes one layer of the polymerized 3-D network. The nanostructured surface cell design according to embodiments of the present invention may be evaluated to achieve an efficiency of about 10% or more. Multijunction cells can be used, including cells in which the multiple layers include layers of porphyrins, chlorins, bacteriochlorins, and phthalocyanines, respectively, using quantum dots in each layer as needed. Both nanostructured and thick (>50mer) polymer structure designs may be used. Cell modeling and testing may be done at each level of design.

Cell Modeling and Comparison with Experiments

Figure 8:
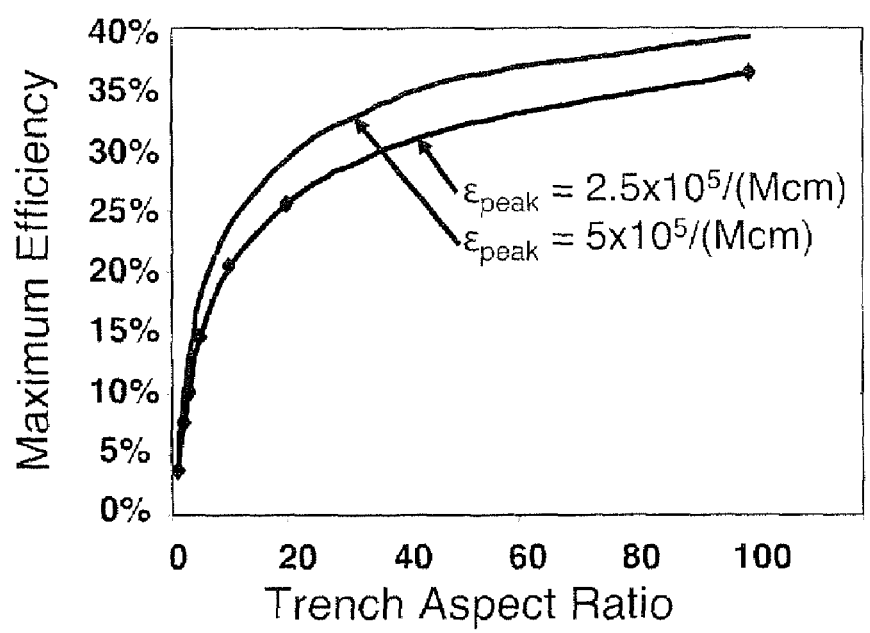
FIG. 8 is a calculated maximum efficiency curve for a single junction nanostructure porphyrin cell according to embodiments of the present invention.

A kinetic model has been developed that incorporates data from steady-state and time-resolved spectroscopic measurements that can allow for the accurate determination of the dynamics of exciton and electron transfer. Simple models of cell photoabsorbance indicate that the planar configurations of porphyrin polymer with 20 unit chains may result in approximately 10% photoabsorbance between 350 and 650 nm, leading to a maximum efficiency of about 4%. Considering expected recombination and open circuit energy loss, it is expected that the actual efficiencies for the monolayer cell may be about 1% or less. Increasing photon absorption may improve efficiency significantly. FIG. 8 is a plot of calculated maximum efficiency (determined from integrated porphyrin absorbance under AM1.5 illumination) vs. aspect ratio for the cell structure shown in FIGS. 1A-1C. The calculated efficiencies do not include increased long wavelength absorption expected with hydroporphyrin and phthalocyanine structures. Actual efficiencies may be less due to energy losses, but increased surface area, or increased near-IR absorption, may also improve cell efficiency. Furthermore, the model predicts spectral sensitivity variations with energy transfer yields, and a simple steady-state photocurrent action spectrum can directly indicate the efficiency with which light absorbed on a specific pigment in the array is converted to incident electrons.

Open-circuit photovoltage $V_{oc}$, can also be understood in terms of energy profiles within the cell. Open-circuit photovoltage can be estimated by the difference in Fermi energies of the two current collectors, and is expected to follow a logarithmic relationship with light intensity described by the diode equation:

$$V_{oc} = \frac{kT}{e} \ln\left(\frac{I_{inj}}{n_{s0} k_{et} N_{ox}}\right)$$

An analog of the diode equation is shown, where $N_{ox}$ is the concentration of the oxidized donor species, $k_{et}$ is the rate constant for reduction by electrons in the $TiO_2$, $n_{S0}$ is the electron concentration in the dark, and $I_{inj}$ is the electron injection flux from the dye under illumination. This relation equates the recombination rate to the injection flux under open circuit conditions. This indicates that under constant current injection, an order of magnitude decrease in the rate constant for charge recombination may increase $V_{oc}$ by 59 mV. For efficient solar energy conversion, the oxidized arrays may be rapidly regenerated. When this is achieved, the quasi-Fermi energy of the photoanode may be determined by recombination of the injected electrons with the hole transport material and will not be sensitive to the identity of the light harvesting array. Model results indicate that the design of the cells of FIGS. 1A-1C may have good regeneration and charge transfer kinetics, and may yield large $V_{oc}$ values that approach the free energy stored in the pigment's singlet excited state. Modeling, including time resolved results, may be used to identify challenges and guide designs to demonstrate high efficiency biomimetic photovoltaic cells.

Molecular-based solar cells may have advantages over purely semiconductor-based solar cells. For example, a molecular-based solar cell according to embodiments of the present invention can be (1) inexpensive, (2) efficient, (3) subject to rational molecular design and optimization, and (4) amenable to fabrication in a thin, lightweight portable design. Cells according to embodiments of the present invention may utilize certain aspects of the quantum dots (e.g., controlled photo-absorption strength), and reduce difficulties of interconnected nanoparticle structures, such as the "dead-ends" in electron transport through the nanowire assembly, the requirement for the diffusive charge transport material and/or trapping in a gel or polymeric hole transport layer.

Results of Porphyrin Synthesis and Photo-Electronic Characterization

Figure 9:
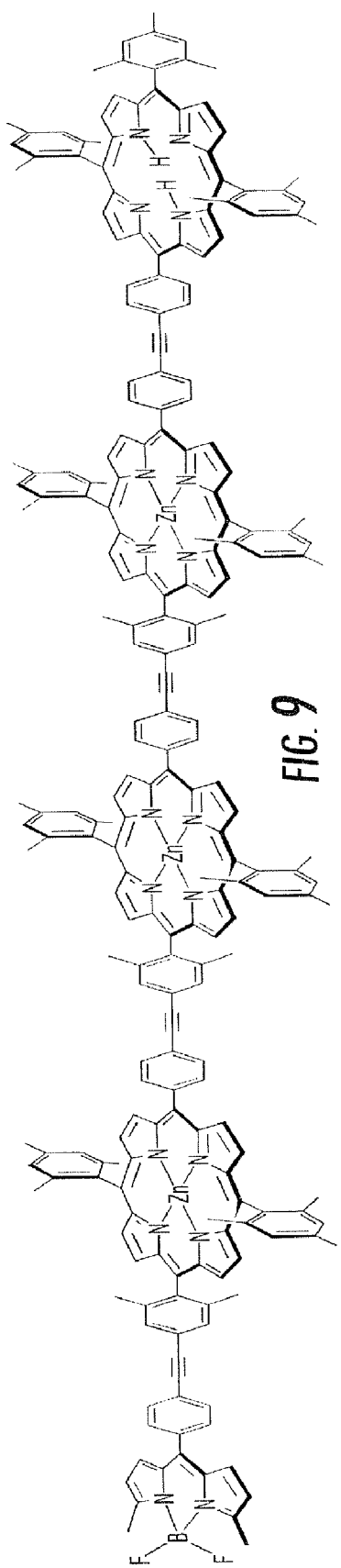
FIG. 9 is a diagram of a porphyrin molecular wire where metalloporphyrins and/or free base porphyrins are joined via diphenylthyne according to embodiments of the present invention.

Porphyrins may be synthesized containing four meso-substituents and chlorins bearing distinct patterns of substituents to give a polymeric 3-D network for a solar cell. Phosphonic acid groups may be incorporated on the porphyrinic macrocycle, thereby enabling attachment to metal oxide surfaces. Molecular building blocks based on phthalocyanines and bacteriochlorins may be used. The phthalocyanines and bacteriochlorins can provide absorption in the red/near-IR spectral regions. Excited-state energy transfer may occur rapidly and efficiently in multiporphyrin arrays in which metalloporphyrins and/or free base porphyrins are joined via diphenylethyne or p-phenylene linkers. An example of a synthesized multi-element porphyrin complex is shown in FIG. 9. Absorption of light by the boron-dipyrrin unit (left end) may be followed by energy migration among the pigments until reaching the lowest energy pigment (right end); the transit time is about 190 ps. P-phenylene linked multiporphyrin arrays may be fabricated that afford more rapid energy-transfer times. Larger synthetic arrays may be constructed such arrays funnel energy to the lowest energy pigment. The energy-transfer (i.e., exciton migration) process may entail a superexchange mechanism.

Figure 10:
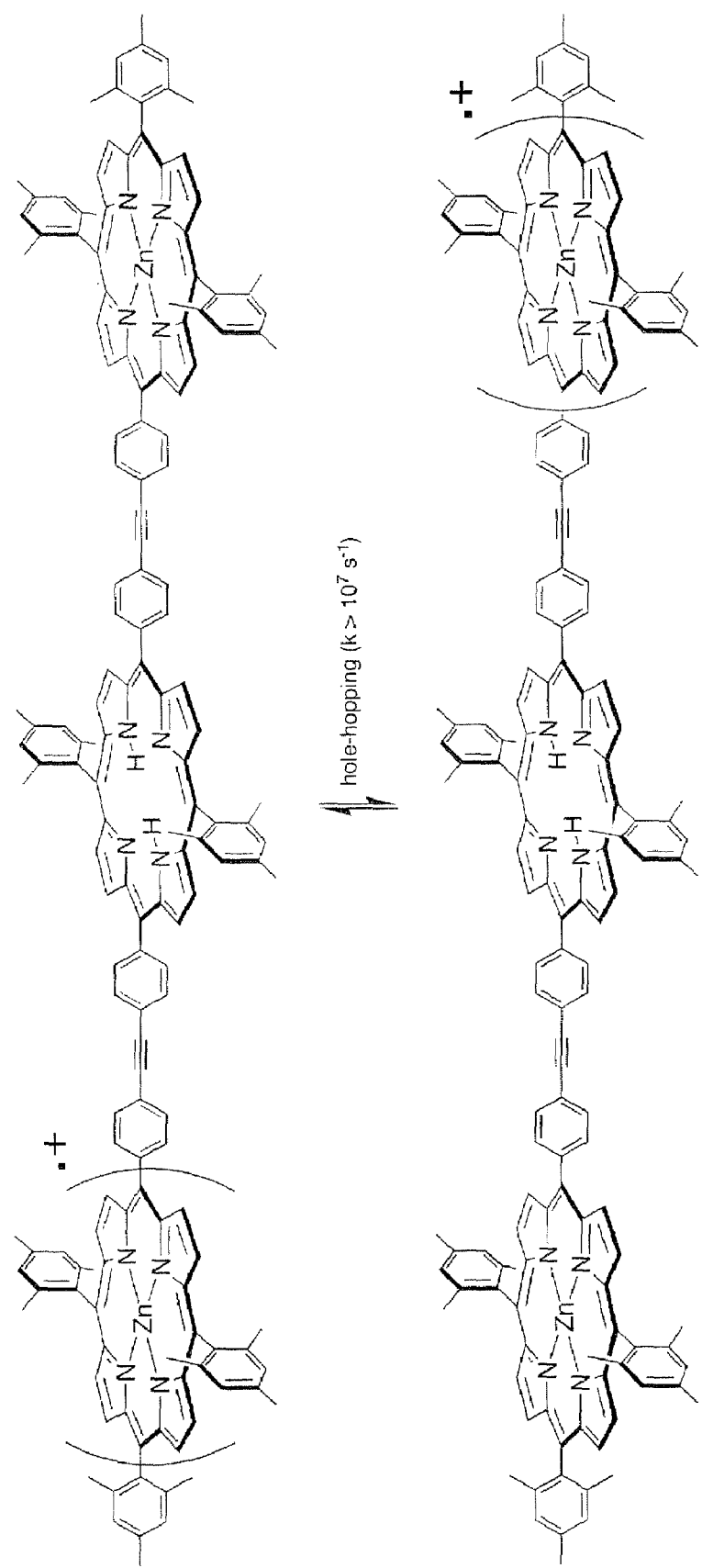
FIG. 10 is a diagram of a porphyrin trimer complex illustrating the effect of hole transport on molecular structure according to embodiments of the present invention.

Ground-state hole migration may be facile among isoenergetic porphyrins in the same types of multiporphyrin arrays. For example, in the triad structure shown in FIG. 10, the formation of a cation radical on one pigment may be followed by rapid hole-hopping to an isoenergetic pigment. The rate of hole hopping is >$10^7$ s$^{-1}$, and again, the hole-hopping process occurs via a superexchange mechanism. The presence of an intervening component (in this case, the free base porphyrin) on which the hole does not reside may not interrupt or hinder hole transport from anode to cathode. Finally, the exciton and hole transport processes can be tuned by design of the porphyrin components (which basically retain their inherent photophysical/electronic characteristics when joined via diphenylethyne orp-phenylene linkers).

Flexible electronic structures according to embodiments of the present invention may have broad applications in displays, sensors, wearable electronics and photovoltaic applications. Many of the challenges to integrate flexible photovoltaics, including materials surfaces, very low temperature processing, materials selection, etc., are common for all materials considered. Low temperature (e.g., <150° C.) inorganic materials processing on flexible substrate surfaces has been examined.

Molecular Synthesis and Structure

Multicomponent hydroporphyrin/phthalocyanines for photovoltaic devices may be synthesized using methodology developed that provides access to chlorin/oxochlorin building blocks with various patterns of substituents. Versatile approaches to phorbin building blocks as well as phthalocyanines may be developed. A phorbin is a chlorin that incorporates an annulated cyclopentanone ring in which the keto group is conjugated with the macrocycle, thereby enhancing the long-wavelength transition and stabilizing the macrocycle toward oxidation as in chlorophyll (see FIG. 5). Multichromophore architectures may exhibit a number of features that can determine how the structure (porphyrin type, linker type, site of porphyrin/linker attachment) influences the mechanism(s) of electronic communication (through space (TS) vs. through bond (TB); adjacent vs. non-adjacent interactions, and the like).

Porphyrin Surface Attachment, Electrochemical Characterization, and Polymerization Strategies for attaching the molecular light-harvesting/charge-injecting materials to the electrode surface can be used for the implementation of multicomponent hydroporphyrin/phthalocyanines in photovoltaic devices according to embodiments of the present invention. A variety of strategies for attaching porphyrinic architectures, including large multicomponent species to semiconductor, semiconductor oxide, and metal surfaces, have been developed. These species have been interrogated via a variety of electrochemical methods, including voltammetry, chronoamperometry, swept waveform AC voltammetry, and open circuit potential amperometry. Strategies for the polymerization of alkyne-functionalized tetrapyrrolic species directly on both semiconductor and metal surfaces have been demonstrated.

Time Resolved Measurements

Knowledge of the rates and yields of energy and charge transfer between constituents in the molecular assemblies and subunits, as well as the photophysical properties of the individual chromophores, may be used for the design and construction of photovoltaic devices according to embodiments of the present invention. This information allows for molecular tuning to achieve properties such as efficient energy/charge flow to a specific site. Studies using static and time-resolved (femtoseconds and slower) absorption and fluorescence spectroscopy have elucidated (i) properties (orbital characteristics, linker motifs) to manipulate rates of excited-state energy transfer, and (ii) electronic communication between non-adjacent sites that facilitates energy/charge flow across large molecular arrays.[3] The ability to tune for energy versus hole/electron transfer can involve manipulating the base chromophore plus ancillary optical/redox moieties. Systems such as perylene-porphyrins and perylene-oxochlorins that select for either >99% ultrafast energy transfer for light-harvesting or nearly quantitative hole/electron transfer with tunable (~$10^{-12}$ to >$10^{-8}$ sec) lifetimes of the charge-separated states for charge transfer/injection may be used. These units also can be used as photo-activated charge injection/detection units for delineating the performance of molecular arrays for subsequent surface attachment.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

That which is claimed is:

1. A solar cell comprising:
   a substrate having a horizontal surface;
   a first electrode layer comprising one of an anode electron transport layer or a cathode electron transport layer on said substrate, said first electrode layer having a plurality of vertical surfaces substantially perpendicular to said horizontal surface;
   light-harvesting rods electrically coupled to said vertical surface of said first electrode layer; and
   a second electrode layer in conformal relationship with said light-harvesting rods on said vertical surface of said first electrode layer, said second electrode layer comprising the other of the anode electron transport layer or cathode electron transport layer.

2. The solar cell of claim 1, further comprising nano-patterned trenches that include said plurality of vertical surfaces.

3. The solar cell of claim 1, further comprising nano-patterned pillars that include said plurality of vertical surfaces.

4. The solar cell of claim 1, wherein the first electrode layer is a nano-patterned layer.

5. The solar cell of claim 1, wherein the substrate is a nano-patterned layer and said first electrode layer is deposited on said substrate.

6. The solar cell of claim 1, wherein said light-harvesting rods each comprise a plurality of photon absorbing particles.

7. The solar cell of claim 6, wherein said plurality of photon absorbing particles are electrically connected at end portions thereof.

8. The solar cell of claim 6, wherein said plurality of photon absorbing particles comprise quantum dots.

9. The solar cell of claim 6, wherein said plurality of photon absorbing particles comprise porphyrin molecules.

10. The solar cell of claim 1, wherein said light-harvesting rods are configured to transmit energy to said first electrode layer without a separate diffusive charge carrier.

11. The solar cell of claim 2, wherein said plurality of trenches define opposing vertical surfaces, and wherein said light-harvesting rods are coupled to each opposing vertical surface.

12. The solar cell of claim 11, wherein a distance between said opposing vertical surfaces is between about 10 nm and 100 microns.

13. The solar cell of claim 11, wherein said light-harvesting rods extend to fill at least a portion of a distance between adjacent ones of said vertical surfaces.

14. The solar cell of claim 1, wherein said first electrode layer comprises said anode electron transport layer said second electrode layer comprises said cathode electron transport layer.

15. The solar cell of claim 1, wherein said first electrode layer comprises said cathode electron transport layer said second electrode layer comprises said anode electron transport.

16. The solar cell of claim 1, wherein said substrate is transparent.

17. The solar cell of claim 1, wherein said substrate is flexible.

18. An electrical device comprising:
a solar cell according to claim 1; and
a circuit electrically coupled to said solar cell.

* * * * *

UNITED STATES PATENT AND TRADEMARK OFFICE
CERTIFICATE OF CORRECTION

PATENT NO. : 7,655,860 B2　　　　　　　　　　　　　　　　　　　　　Page 1 of 1
APPLICATION NO. : 11/394560
DATED : February 2, 2010
INVENTOR(S) : Parsons It is certified that error appears in the above-identified patent and that said Letters Patent is hereby corrected as shown below:

Column 12, Line 26: Please correct "50%" to read -- ~50% --
and correct "1.5%" to read -- ~1.5% --.

Signed and Sealed this

Fifteenth Day of June, 2010

David J. Kappos
*Director of the United States Patent and Trademark Office*